(12) United States Patent
Fu et al.

(10) Patent No.: US 9,780,023 B2
(45) Date of Patent: Oct. 3, 2017

(54) CHIP ON FILM UNIT

(71) Applicant: SHENZHEN CHINA STAR OPTOELECTRONICS TECHNOLOGY CO., LTD., Shenzhen (CN)

(72) Inventors: Wei Fu, Shenzhen (CN); Yu Yeh Chen, Shenzhen (CN); Yin Hung Chen, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,679

(22) PCT Filed: Dec. 25, 2014

(86) PCT No.: PCT/CN2014/094884
§ 371 (c)(1),
(2) Date: Apr. 20, 2016

(87) PCT Pub. No.: WO2016/090682
PCT Pub. Date: Jun. 16, 2016

(65) Prior Publication Data
US 2016/0365308 A1  Dec. 15, 2016

(30) Foreign Application Priority Data

Dec. 10, 2014  (CN) .......................... 2014 1 0751795

(51) Int. Cl.
*G11C 5/06*  (2006.01)
*G11C 8/12*  (2006.01)
(Continued)

(52) U.S. Cl.
CPC ........ *H01L 23/49838* (2013.01); *G02F 1/133* (2013.01); *G02F 1/136* (2013.01);
(Continued)

(58) Field of Classification Search
CPC ........... H01L 23/49838; H01L 23/4985; H01L 23/5387; G01F 1/133; G01F 1/133305; G01F 1/133345; G01F 1/136
(Continued)

(56) References Cited

U.S. PATENT DOCUMENTS 7,342,634 B2 * 3/2008 Park .................... G02F 1/13452
345/100
2006/0244708 A1 * 11/2006 Yi ........................ G02F 1/13452
345/98
(Continued)

FOREIGN PATENT DOCUMENTS

CN  101118897 A  *  2/2008  ............. H01L 24/17
CN  101231987 A  *  7/2008
JP  10093210 A  *  4/1998

*Primary Examiner* — Ly D Pham
(74) *Attorney, Agent, or Firm* — Buchanan Ingersoll & Rooney PC

(57) ABSTRACT

In the technical field of liquid crystal technology, a chip on film unit is provided. The chip on film unit comprises a soft dielectric layer, a plurality of pins for input signals disposed on the dielectric layer, and a first drive circuit module and a second drive circuit module. The first drive circuit module is connected with at least a portion of the pins for the input signals, and cascade wires are disposed between the first drive circuit module and the second drive circuit module for transmitting cascade signals therebetween. The number of signal channels in each of the drive circuit modules can be half of that required by the entire chip on film. As a result, the signal channels are distributed in a plurality of drive circuit modules, and the thermal efficiency can be significantly improved.

12 Claims, 2 Drawing Sheets

(51) Int. Cl.
*H01L 23/498* (2006.01)
*G02F 1/133* (2006.01)
*G02F 1/1333* (2006.01)
*G02F 1/136* (2006.01)
*H01L 23/538* (2006.01)

(52) U.S. Cl.
CPC .. *G02F 1/133305* (2013.01); *G02F 1/133345* (2013.01); *H01L 23/4985* (2013.01); *H01L 23/5387* (2013.01)

(58) Field of Classification Search
USPC .......................................................... 365/63
See application file for complete search history.

(56) References Cited

U.S. PATENT DOCUMENTS

| | | | |
|---|---|---|---|
| 2007/0076159 A1* | 4/2007 | Lee | G02F 1/13452 349/149 |
| 2008/0048708 A1* | 2/2008 | Hsu | G09G 3/006 324/754.03 |
| 2010/0053057 A1* | 3/2010 | Chung | G09G 3/3685 345/98 |
| 2010/0139953 A1* | 6/2010 | Kim | H05K 3/323 174/256 |
| 2013/0257841 A1* | 10/2013 | Shim | G06F 3/038 345/212 |

* cited by examiner

CHIP ON FILM UNIT

CROSS REFERENCE TO RELATED APPLICATION

The present application claims benefit of Chinese patent application CN 201410751795.X, entitled "Chip on Film Unit" and filed on Dec. 10, 2014, the entirety of which is incorporated herein by reference.

TECHNICAL FIELD

The present disclosure relates to the technical field of liquid crystal display, and in particular, to a chip on film unit.

TECHNICAL BACKGROUND

COF, short for chip on flex or chip on film, is widely used in the technical field of liquid crystal display. It mainly relates to the technique of securing an integrated circuit to a flexible circuit board, wherein a soft stand-by circuit is used as the carrier for packaging a chip, so as to electrically joint the chip to the soft substrate.

FIG. 1 shows a chip on film unit in the prior art. In the prior art, only one drive circuit module is usually arranged in a chip on film unit. However, the above-mentioned arrangement fails to facilitate the heat dissipation and cooling of the chip on film unit. As shown in FIG. 1, the chip on film unit in the prior art comprises a soft dielectric layer 1, and a drive circuit module 2 disposed on the soft dielectric layer 1. An input signal 3 and an output signal 4 are provided to the drive circuit module 2 accordingly. Because all signal channels of the chip on film unit are disposed in the single drive circuit module 2, it is very difficult for the chip on film to dissipate heat and cool off. As a result, the protection and maintenance of the chip on film unit will be difficult to realize.

SUMMARY OF THE INVENTION

With respect to the defect of poor heat dissipation and cooling of the chip on film unit in the prior art, the present disclosure provides an improved chip on film unit, which can effectively solve the problem in the prior art and further achieve new beneficial effects.

A chip on film unit is provided according to the present disclosure, comprising: a soft dielectric layer, a plurality of pins for input signals disposed on the soft dielectric layer, and a first drive circuit module and a second drive circuit module, wherein the first drive circuit module is connected with at least a portion of the pins for the input signals, and cascade wires are disposed between the first drive circuit module and the second drive circuit module for transmitting cascade signals therebetween.

The number of signal channels in each of the drive circuit modules can be half of that required by the entire chip on film. In this case, the signal channels are distributed in a plurality of drive circuit modules, and the thermal efficiency can be significantly improved accordingly.

Preferably, only one first drive circuit module is provided. Of course, the number of the first drive circuit module is not restrictive.

Preferably, all the pins for the input signals are connected with the first drive circuit module, so that the input signals can be transmitted into the first drive circuit module, and the input signals are transmitted to the second drive circuit module in form of cascade signals between the first drive circuit module and the second drive circuit module. In this case, the drive circuit modules each can receive all the input signals required to fulfill the functions thereof, and output corresponding output signals.

Preferably, the input signals and the cascade signals each comprise a power signal, a data signal, and a control signal.

Preferably, the input signals comprise a power signal, a data signal, and a control signal. Preferably, pins used for the data signals and the control signals of the input signals are connected with the first drive circuit module only. Both the first drive circuit module and the second drive circuit module are connected with pins used for the power signals of the input signals. The data signals and the control signals of the input signals are transmitted to the second drive circuit module in form of cascade signals between the first drive circuit module and the second drive circuit module. As a result, the drive circuit modules each can receive all the input signals required to fulfill the functions thereof, and output corresponding output signals. In addition, the power signals of the input signals are separately transmitted respectively to the first drive circuit module and the second drive circuit module, so that the temperatures of the two drive circuit modules can keep the same.

Preferably, the cascade signals comprise a data signal and a control signal. Because the first drive circuit module and the second drive circuit module each have received power signals of the input signals, it is unnecessary to transmit power signals in form of cascade signals.

Preferably, only one second drive circuit module is provided.

Preferably, the first drive circuit module and the second drive circuit module each are constructed in the form of a chip, which is connected with the pins used for the input signals through a projection disposed on a surface thereof facing the soft dielectric layer.

Preferably, the cascade wires are arranged on the soft dielectric layer.

Furthermore, in the chip on film unit according to the present disclosure, because cascade signals are subtly provided between the first drive circuit module and the second drive circuit module, the number of pins can be significantly reduced. In this case, each pin can have a larger width, so as to be more secure, thereby the risk of being fractured can be reduced while the thermal efficiency is improved. As a result, the quality of the chip on film unit can be guaranteed. In the meantime, based on the improvements made according to the present disclosure, the problem of nonuniform temperature of different drive circuit modules, in particular, can be solved, thereby the uniformity of temperature of the entire chip on film unit can be guaranteed.

As long as the objective of the present disclosure is satisfied, the above technical features can be combined together in any suitable manner or replaced with equivalent technical features.

BRIEF DESCRIPTION OF THE ACCOMPANYING DRAWINGS

The present disclosure will be described in detail based on the embodiments and with reference to the accompanying drawings. In which.

Figure 1:
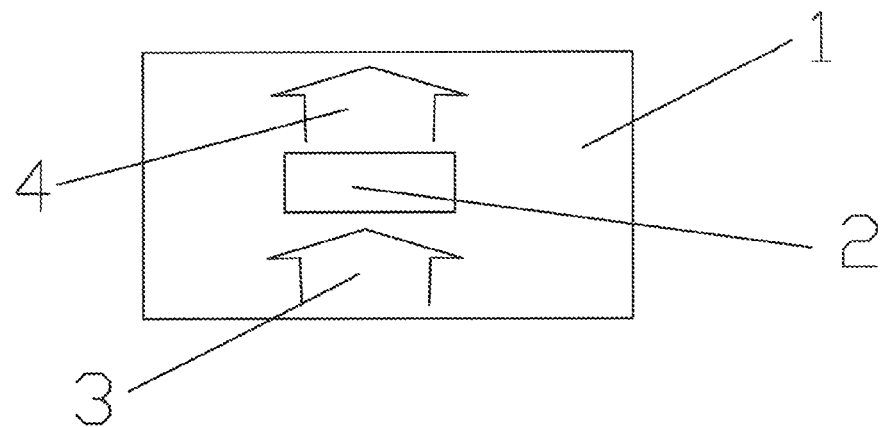
FIG. 1 shows a chip on film unit in the prior art.

In the drawings, same components are indicated with the same reference sign. The drawings are not drawn to actual scale.

DETAILED DESCRIPTION OF THE EMBODIMENTS

The present disclosure will be further illustrated in detail in view of the accompanying drawings.

Figure 2:
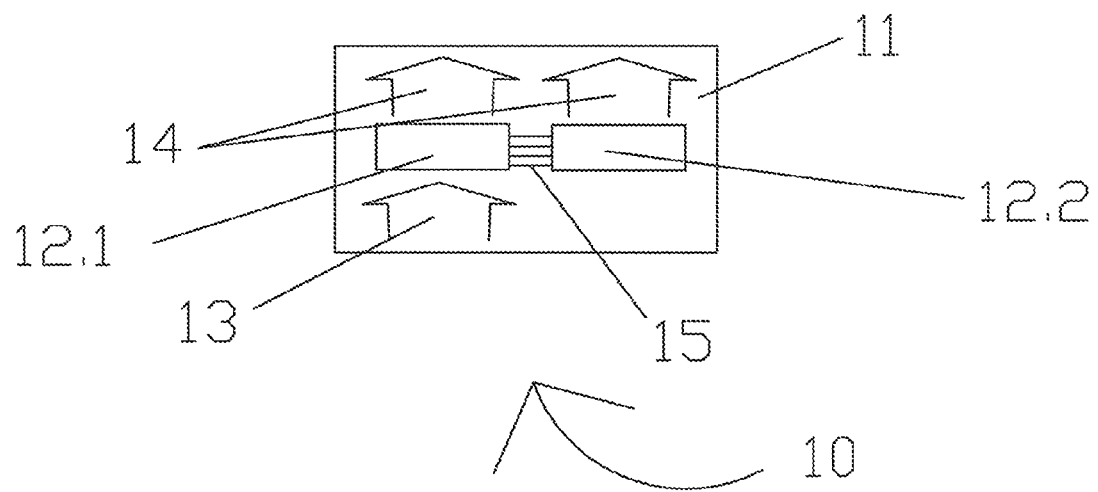
FIG. 2 shows a chip on film unit according to example 1 of the present disclosure.

FIG. 2 shows a chip on film unit 10 according to example 1 of the present disclosure. As clearly shown in FIG. 2, the chip on film unit 10 comprises a soft dielectric layer 11. The soft dielectric layer 11 is a flexible carrier that can be made from polyimide, for example.

A plurality of pins (not shown) used for input signals are disposed on the soft dielectric layer 11, which can act as a carrier membrane for these pins, so as to facilitate a belt-like transmission.

Two drive circuit modules are arranged on the soft dielectric layer 11, namely a first drive circuit module 12.1 and a second drive circuit module 12.2. The first drive circuit module 12.1 and the second drive circuit module 12.2 are spaced apart with respect to each other for a certain distance, which can be determined by the size of the soft dielectric layer 11 and the processing technology. The number of signal channels in each of the drive circuit modules can be half of that required by the entire chip on film unit 10. In this case, the signal channels can be distributed in a plurality of drive circuit modules, thereby the thermal efficiency can be significantly improved.

As compared with the design in the prior art, in which only one drive circuit module is disposed on a soft dielectric layer, the chip on film unit 10 according to the present disclosure comprises two drive circuit modules, and the number of signal channels in each of the drive circuit modules can be half of that required by the drive circuit module in the prior art (under the condition of the same signal transmission ability). In this case, not only the requirement of signal output can be satisfied, but the thermal efficiency of the entire chip on film unit 10 can be improved as compared with the prior art by means of arranging the drive circuits in two modules with space being arranged therebetween.

The first drive circuit module 12.1 is connected with all the pins (not shown) used for input signals. Cascade wires 15 are disposed between the first drive circuit module 12.1 and the second drive circuit module 12.2 for transmitting cascade signals therebetween. The cascade wires 15 can be disposed on the soft dielectric layer 11. The second drive circuit module 12.2 is not connected with the pins.

According to example 1 as shown in FIG. 2, only one first drive circuit module 12.1 and one second drive circuit module 12.2 are arranged therein. Of course, this is only for exemplarily showing the technical effects of improving the thermal efficiency of the entire chip on film unit by means of a dispersed arrangement of drive circuit modules according to a technical solution of the present disclosure. The number of the drive circuit modules is not restrictive. As long as the technical condition and the size of the soft dielectric layer 11 are allowable, the number of the first drive circuit module 12.1 and that of the second drive circuit module 12.2 can both be plural, and the cascade wires 15 can also have a different structure.

In the chip on film unit 10 as shown in FIG. 2, all the pins used for input signals 13 are connected with the first drive circuit module 12.1, so that the input signals 13 can be inputted to the first drive circuit module 12.1, and then transmitted to the second drive circuit module 12.2 in form of cascade signals between the first drive circuit module 12.1 and the second drive circuit module 12.2. Specifically, the cascade signals can be transmitted through the cascade wires 15. As a result, the drive circuit modules each can receive all the input signals required for fulfilling the functions thereof, and output corresponding output signals 14.

Furthermore, although FIG. 2 does not show the specific connection mode between the pins used for the input signals 13 and the first drive circuit module 12.1, according to the transmission mode of the input signals 13 and that of the output signals 14 as shown in FIG. 2, it should be easy to understand that the pins used for the input signals 13 are all connected with the first drive circuit module 12.1, but not connected with the second drive circuit module 12.2. In other words, the input signals received by the second drive circuit module 12.2 are completely from the cascade wires 15 disposed between the first drive circuit module 12.1 and the second drive circuit module 12.2.

Specifically, the input signals 13 and the cascade signals each can comprise a power signal (VAA/VDD/VGM, and the like), a data signal, and a control signal (DIO/POL, and the like).

In addition, the first drive circuit module 12.1 and the second drive circuit module 12.2 each can be constructed in the form of a chip, which is connected with the pins used for the input signals 13 through a projection disposed on a surface thereof facing the soft dielectric layer 11. The chips and the soft dielectric layer 11 can be bonded to each other through filling glue therebetween.

Figure 3:
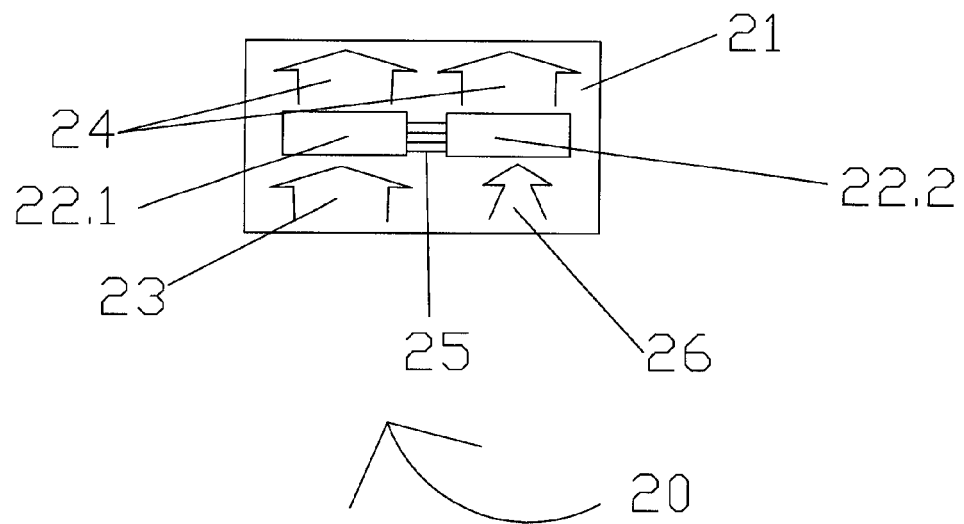
FIG. 3 shows a chip on film unit according to example 2 of the present disclosure.

FIG. 3 shows a chip on film unit 20 according to example 2 of the present disclosure. As clearly shown in FIG. 3, first of all, the chip on film unit 20 comprises a soft dielectric layer 21. A plurality of pins (not shown) used for input signals is disposed on the soft dielectric layer 21, which can act as a carrier membrane for these pins.

Two drive circuit modules are further arranged on the soft dielectric layer 21, namely a first drive circuit module 22.1 and a second drive circuit module 22.2. The first drive circuit module 22.1 and the second drive circuit module 22.2 are spaced apart with respect to each other for a certain distance.

Cascade wires 25 are disposed between the first drive circuit module 22.1 and the second drive circuit module 22.2 for transmitting cascade signals therebetween. The cascade wires 25 can be arranged on the soft dielectric layer 21.

According to example 2 as shown in FIG. 3, only one first drive circuit module 22.1 and one second drive circuit module 22.2 are arranged therein. Of course, the above arrangement is only exemplary, rather than restrictive. As long as the technical condition and the size of the soft dielectric layer 21 are allowable, the number of the first drive circuit module 22.1 and that of the second drive circuit module 22.2 can both be plural, and the cascade wires 25 can also have a different structure.

In the chip on film unit 20 as shown in FIG. 3, the input signals comprise a power signal (VAA/VDDNGM, and the like), a data signal, and a control signal (DIO/POL, and the like).

As shown in the drawing, the data signals and the control signals of the input signals are inputted into the first drive circuit module 22.1 only, and the power signals 23, 26 of the input signals are inputted into the first drive circuit module 22.1 and the second drive circuit module 22.2 respectively.

The data signals and the control signals of the input signals are transmitted to the second drive circuit module 22.2 in form of cascade signals through the cascade wires 25 disposed between the first drive circuit module 22.1 and the second drive circuit module 22.2.

In terms of structure, the above technical solution can be embodied through many specific forms. According to example 2 as shown in FIG. 3, pins used for the data signals and the control signals of the input signals are connected with the first drive circuit module 22.1 only, while the first drive circuit module 22.1 and the second drive circuit module 22.2 are respectively connected with different pins used for the power signals of the input signals. In the meantime, cascade wires 25 are arranged between the first drive circuit module 22.1 and the second drive circuit module 22.2 for transmitting cascade signals therebetween.

The cascade signals between the first drive circuit module 22.1 and the second drive circuit module 22.2 mainly comprise a data signal and a control signal. Because the first drive circuit module 22.1 and the second drive circuit module 22.2 each have received power signals of the input signals respectively, it is unnecessary to transmit the power signals through the cascade wires 25. In this case, the data signals and the control signals received by the first drive circuit module 22.1 can be transmitted to the second drive circuit module 22.2 through the cascade wires 25 disposed between the first drive circuit module 22.1 and the second drive circuit module 22.2, so that the drive circuit modules each can receive all the input signals required for fulfilling the functions thereof and output corresponding output signals 24.

Similar to example 1 as shown in FIG. 2, in example 2 as shown in FIG. 3, the first drive circuit module 22.1 and the second drive circuit module 22.2 each are constructed in the form of a chip, which is connected with the pins used for the input signals 23, 26 through a projection disposed on a surface thereof facing the soft dielectric layer 21. The chips and the soft dielectric layer 21 can be bonded to each other through filling glue therebetween.

As compared with example 1, example 2 is different mainly in that the power signals of the input signals are separately transmitted respectively to the first drive circuit module 22.1 and the second drive circuit module 22.2.

According to example 1, only the first drive circuit module 12.1 receives the power signals, i.e., only the first drive circuit module 12.1 is connected with the pins for the power signals, while the second drive circuit module 12.2 is not connected with the pins for the power signals. Consequently, the temperature of the first drive circuit module 12.1 will be higher than that of the second drive circuit module 12.2, causing the temperature over the entire chip on film unit 10 to be nonuniform. Under such circumstances, in example 2, improvements are made on account of the above problem. Specifically, the power signals of the input signals are separately transmitted respectively to the first drive circuit module 22.1 and the second drive circuit module 22.2, so as to keep the temperatures of the two drive circuit modules being well balanced. In the meantime, as compared with the chip on film unit in the prior art described in the Technical Background section, the chip on film unit 20 according to example 2 can still have the advantage of improved thermal efficiency and cooling effect.

Figure 4:
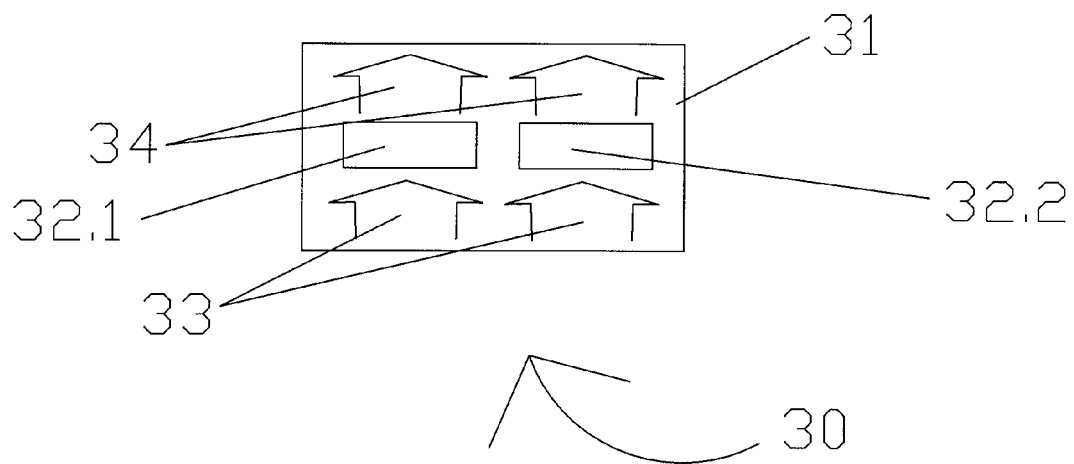
FIG. 4 shows a comparison example which is provided for illustrating the advantages of the chip on film unit according to the present disclosure.

FIG. 4 shows a chip on film unit 30 according to a comparison example, which is provided for illustrating the advantages of the chip on film unit according to the present disclosure. As clearly shown in FIG. 4, first of all, the chip on film unit 30 in the comparison example comprises a soft dielectric layer 31. A plurality of pins (not shown) used for input signals are arranged on the soft dielectric layer 31.

Two drive circuit modules are arranged on the soft dielectric layer 31, namely a first drive circuit module 32.1 and a second drive circuit module 32.2. The first drive circuit module 32.1 and the second drive circuit module 32.2 are spaced apart with respect to each other for a certain distance.

The chip on film unit 30 according to the comparison example differs from the chip on film units 10 and 20 according to the present disclosure in that the first drive circuit module 32.1 and the second drive circuit module 32.2 thereof are both connected with pins (not shown) used for all the input signals, and no cascade wires are arranged between the first drive circuit module 32.1 and the second drive circuit module 32.2.

According to the comparison example, the first drive circuit module 32.1 and the second drive circuit module 32.2 each receive all the input signals 33 independently. Specifically, the input signals 33 can comprise a power signal, a data signal, and a control signal. In the meantime, the first drive circuit module 32.1 and the second drive circuit module 32.2 each output corresponding output signals 34 independently.

It can be found out that, as compared with the chip on film unit in the prior art, although the problem of difficulty in heat dissipation and cooling can also be solved through the disperse arrangement of drive circuit modules (under the condition of the same signal transmission ability, and the number of signal channels in each drive circuit module in the comparison example is half of that in the prior art) in the chip on film unit 30 according to the comparison example. However, the two drive circuit modules in the comparison example require two sets of input signals, and the number of pins for the input signals required by the chip on film unit 30 according to the comparison example is twice that required by the chip on film unit 10 (as shown in FIG. 2) according to example 1 of the present disclosure. This is because in example 1 all the input signals are transmitted to the second drive circuit module 12.2 through the cascade wires instead of the pins. For the same reasons, as compared with example 2, the number of pins required by the chip on film unit 30 according to the comparison example is also much larger. Because in example 2, the data signals and the control signals are transmitted to the second drive circuit module 22.2 through the cascade wires instead of the pins, the number of the excessive pins in the comparison example equals to that of the pins for the data signals and the control signals in each set of the input signals.

In the soft dielectric layer with limited space, the larger the number of pins, the smaller the width of each of the pins must be. In this case, the risk of fracture of the pins will be increased, as any vibration or stretch generated during transportation or assembly would bring the possibility of fracture of the pins.

In contrast, in the chip on film units 10 and 20 according to the present disclosure, cascade signals are provided between the first drive circuit module and the second drive circuit module, so that the number of pins can be significantly reduced as compared with the comparison example, thereby each of the pins can have larger width and better robustness. As a result, the risk of fracture of the pins can be reduced while the thermal efficiency is improved, and the quality of the chip on film units produced can be guaranteed accordingly. In addition, according to example 2, in which further improvements are made to the present disclosure, the problem of nonuniform temperature over different drive circuit modules can be further solved, thereby temperature uniformity over the entire chip on film unit can be guaranteed.

Although the present disclosure has been described with reference to preferred embodiments, various modifications and variants to the present disclosure may be made by anyone skilled in the art, without departing from the scope and spirit of the present disclosure. In particular, as long as there is no structural conflict, various embodiments as well as the respective technical features mentioned herein may be combined with one another in any manner. The present disclosure is not limited to the specific examples disclosed herein, but rather includes all the technical solutions falling within the scope of the claims.

The invention claimed is:

1. A chip on film unit, comprising:
   a soft dielectric layer,
   a plurality of pins for input signals disposed on the soft dielectric layer, and
   a first drive circuit module and a second drive circuit module,
   wherein each of the first drive circuit module and the second drive circuit module is connected with a portion of the pins for the input signals, and cascade wires are disposed between the first drive circuit module and the second drive circuit module for transmitting cascade signals therebetween;
   wherein the pins for the input signals are not disposed between the first drive circuit module and the second drive circuit module;
   wherein the input signals comprise a power signal, a data signal, and a control signal;
   wherein pins used for the data signal and the control signal of the input signals are connected with the first drive circuit module only,
   pins used for the power signal of the input signals are connected with both the first drive circuit module and the second drive circuit module, and
   the data signals and the control signals of the input signals are transmitted to the second drive circuit module in form of cascade signals between the first drive circuit module and the second drive circuit module.

2. The chip on film unit according to claim 1, wherein only one first drive circuit module is provided.

3. The chip on film unit according to claim 1, wherein the cascade signals comprises a data signal and a control signal.

4. The chip on film unit according to claim 1, wherein only one second drive circuit module is provided.

5. The chip on film unit according to claim 2, wherein only one second drive circuit module is provided.

6. The chip on film unit according to claim 1, wherein the first drive circuit module and the second drive circuit module each are constructed in the form of a chip, which is connected with the pins used for the input signals through a projection disposed on a surface facing the soft dielectric layer.

7. The chip on film unit according to claim 2, the first drive circuit module and the second drive circuit module each are constructed in the form of a chip, which is connected with the pins used for the input signals through a projection disposed on a surface facing the soft dielectric layer.

8. The chip on film unit according to claim 1, wherein the cascade wires are arranged on the soft dielectric layer.

9. The chip on film unit according to claim 2, wherein the cascade wires are arranged on the soft dielectric layer.

10. The chip on film unit according to claim 1, comprising only two drive circuit modules.

11. The chip on film unit according to claim 1, wherein the cascade wires are configured not to transmit the power signal between the first drive circuit module and the second drive circuit module.

12. The chip on film unit according to claim 1, wherein the pins used for the power signal of the input signals are connected directly with both the first drive circuit module and the second drive circuit module.

* * * * *